(12) United States Patent
Jaurimo et al.

(10) Patent No.: US 7,564,126 B2
(45) Date of Patent: Jul. 21, 2009

(54) INTEGRATED CIRCUIT PACKAGE

(75) Inventors: Saku Jaurimo, Tampere (FI); Sakari Sippola, Tampere (FI)

(73) Assignee: Nokia Corporation, Espoo (FI)

( * ) Notice: Subject to any disclaimer, the term of this patent is extended or adjusted under 35 U.S.C. 154(b) by 676 days.

(21) Appl. No.: 11/206,229

(22) Filed: Aug. 16, 2005

(65) Prior Publication Data

US 2007/0040271 A1 Feb. 22, 2007

(51) Int. Cl.
*H01L 23/06* (2006.01)
(52) U.S. Cl. .................. 257/686; 257/777; 257/724
(58) Field of Classification Search ............... 257/686, 257/777, 723, 724
See application file for complete search history.

(56) References Cited

U.S. PATENT DOCUMENTS

| | | | |
|---|---|---|---|
| 6,815,746 B2 * | 11/2004 | Suzuki et al. ............ 257/296 |
| 7,009,303 B2 * | 3/2006 | Kuroda et al. ............ 257/777 |
| 7,352,068 B2 * | 4/2008 | Kuroda et al. ............ 257/777 |
| 2001/0040282 A1 * | 11/2001 | Corisis et al. ............ 257/686 |
| 2004/0130036 A1 * | 7/2004 | Owaki et al. ............ 257/777 |
| 2006/0110849 A1 * | 5/2006 | Lee et al. ............ 438/106 |

* cited by examiner

*Primary Examiner*—S. V Clark
(74) *Attorney, Agent, or Firm*—Ware, Fressola, Van Der Sluys & Adolphson LLP

(57) ABSTRACT

An integrated circuit package comprising: an substrate having a first main surface and a second main surface which are opposite to each other; a first plurality of external terminals disposed on the first main surface of said interconnection substrate; and a second plurality of external terminals disposed on the second main surface of said interconnection substrate; wherein said second plurality of external terminals comprises a predefined selection of shared external terminals defining a first interface for an integrated circuit memory package having type NAND or type NOR memory.

15 Claims, 3 Drawing Sheets

INTEGRATED CIRCUIT PACKAGE

BACKGROUND OF THE INVENTION

The present invention relates to the field of electronic interconnection structures and IC packaging technology.

Current integrated circuit (IC) chip packaging technologies commonly rely on an interconnection substrate containing circuitry to serve as an interconnection base. The interconnection base redistributes the I/O (input/output) terminals or external terminals of the IC to a more optimized contact spacing for making an interconnection between I/O terminals or external terminals of the other parts of assembly. An example of the assembly is when the IC package is mounted on and interconnected to a printed circuit board (PCB). The interconnection between the IC chip or die and the chosen package is normally accomplished using wire bonding, which connects the chip terminals to terminals on the package by thin wires. Alternatively, the chip terminals are interconnected to the IC package substrate by means of metal bumps, solder balls or conductive adhesives. Also, several stacked chips within an IC package may be provided.

The I/O terminals of the IC package are located in various manners depending on the IC package design. For area array type IC packages, the I/O contact terminals are located all on one surface of the IC package. In some IC package designs the contacts are disposed in a manner that facilitates stacking of packages, possibly with through access from the bottom to the top surface for area array type packages, for accomplishing a package-on-package (POP) structured semiconductor device. One special case is for stacking a memory IC with an ASIC IC (Application Specific Integrated Circuit) to increase PCB density. In such area array IC packages the external terminals may be provided with a common land or terminal that can be accessed from both the top and the bottom.

POP type semiconductor devices exist currently on the market with different package dimensions. However, optimized high frequency and high bus width interfaces for POP devices have not been available. Present day POP devices provide support for only one mass memory interface (Flash memory) and a low frequency, 16-bit DDR SDRAM memory (Double Data Rate Synchronous Dynamic Random Access Memory). SDRAM is a type of DRAM memory that can run at higher clock speeds than conventional memory. Flash memory is a special type of EEPROM memory (Electrically Erasable Programmable Read-only Memory).

There are two major architectures of flash memory: NOR and NAND. NOR applications typically use the memory to store and execute operating system (OS) code. As a result, the NOR products evolved with lower density and higher random access performance compared to NAND flash memory with higher density and faster sequential access. While this meets the application needs, the higher cost-per-bit compared to the NAND products makes it an inappropriate choice as a storage media. The applications for NAND flash memory evolved later, as the demand for higher density for storage emerged. NAND applications use the memory to store large quantities of information and therefore require much higher density. With the NOR and NAND memories having such distinct characteristics, it should be possible to choose the appropriate one for each application or semiconductor device. In particular, it should be possible to provide the ASIC IC package easily with appropriate flash memory of choice.

Moreover, present day POP devices provide limited mechanical reliability due to the number and location of solder balls supporting the top device of the POP package.

SUMMARY OF THE INVENTION

An object of the present invention is to provide a semiconductor device defining the electrical and mechanical interface for a POP device. The package comprises a memory IC package disposed above an ASIC IC package.

Another object of the present invention is to provide a POP device with mechanical reliability. Corners of the ASIC IC package are provided with solder balls supporting the top device of the POP package. The supporting solder balls do not provide live interconnections between the memory IC and the ASIC IC, thereby they are defined as NC (Not Connected or No Connection).

Another object of the present invention is to provide the usage of high I/O bus width and high frequency memory components. The novel features of the flash memory I/O bus enables the usage of either NOR or NAND memory with unchanged device pin layout. The flash memory I/O bus provides a reduced number of external terminals compared to I/O buses having separate pins for the various flash memory types.

Another object of the present invention is to reduce the number of the pins or the external terminals of the package, the ASIC IC package in particular. Due to a limited number of available space and external terminals, solder balls in particular, the usage of pins and the number of pins is critical in POP devices in particular. The flash memory I/O bus or interface uses shared pins for the NOR and NAND type memories for reducing the amount of pins used exclusively for either one of the types.

Another object of the present invention is to provide an optimized I/O bus or interface for a 32-bit DDR SDRAM memory with either a NAND type or NOR type flash memory. The interface multiplexes NAND and NOR memory signals for providing a reduced I/O bus width for the package, and a reduced external terminal or pin count between the upper memory IC package and the lower ASIC IC package in particular. The multiplexed interface provides support for both NAND and NOR type flash memories with a minimum external terminal count, thereby enabling the choice between the NAND type or NOR type according to the requirements of the application or particular hardware.

The ASIC IC is typically an applications processor providing a multi-engine architecture for mobile device manufacturing and supporting various cellular standards. The ASIC IC provides integrated memory controllers both for NAND/NOR flash memory and DDR memory (Double Data Rate).

Another object of the present invention is to provide an optimized signal placement of the DDR SDRAM I/O bus for reduced signal interference.

Another object of the invention is to provide a mobile device comprising an integrated circuit package.

Another object of the invention is to provide an integrated circuit package of type package-on-package (POP).

DESCRIPTION OF THE PREFERRED EMBODIMENTS

Figure 1:
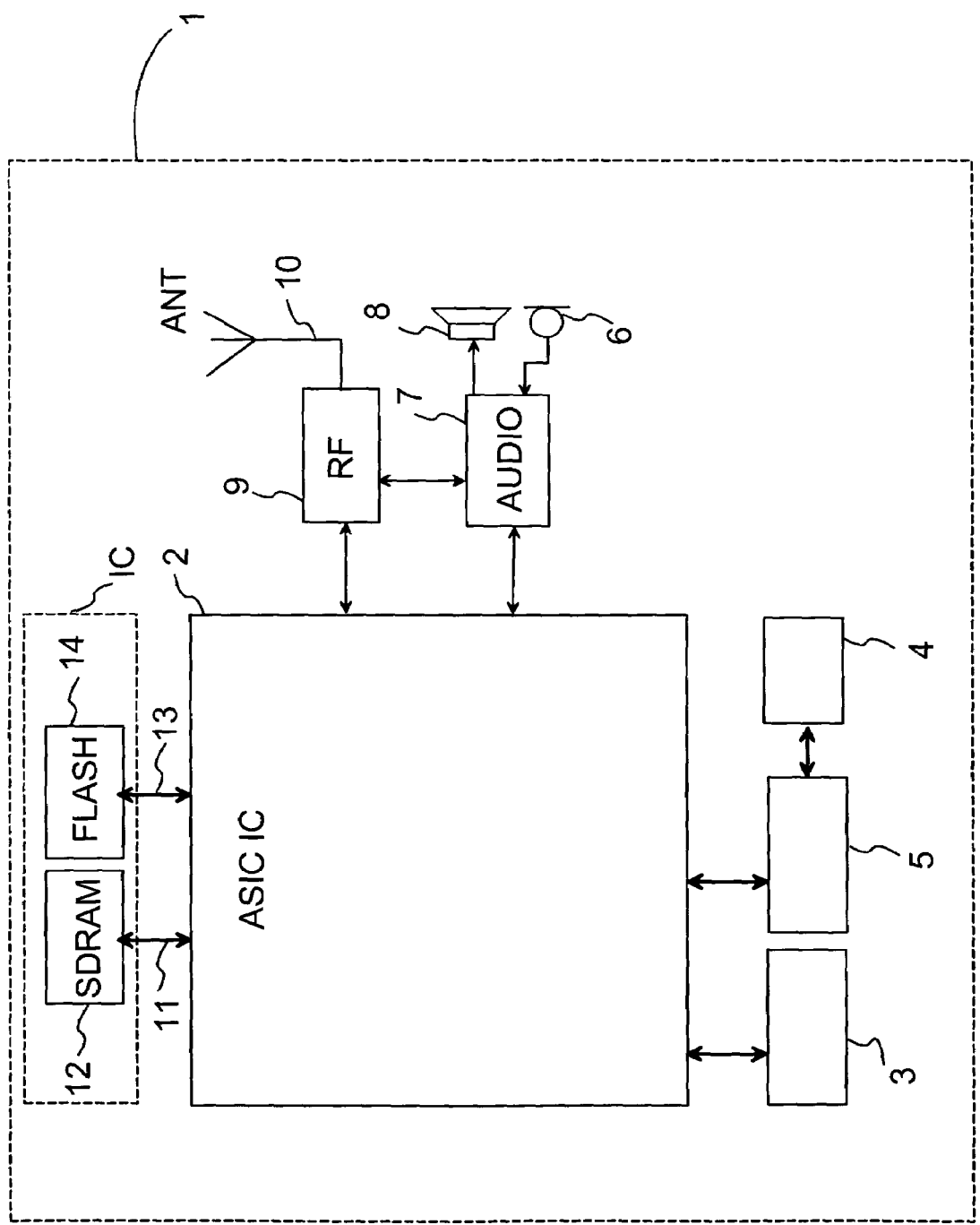
FIG. 1 is a simplified block diagram showing a mobile device 1 in which the invention is applied.

Embodiments of the present invention will be described more specifically with reference to the accompanying drawings. In all the drawings illustrating the embodiments of the present invention, like elements having the same function will be identified by like reference numerals.

FIG. 1 is a simplified block diagram showing in one embodiment of the invention a mobile device 1 in which the invention is applied. The mobile device 1 functions in a way known as such. The mobile device 1, a mobile communication device or a mobile phone in particular, is a communication device comprising data processing functions and mobile station functions. Functions of the mobile device 1 are implemented in an ASIC IC 2. The ASIC IC 2 comprises e.g. a micro processing unit (MPU) being a universal RISC processor (Reduced Instruction Set Computer) and having cache memory. Furthermore, the ASIC IC 2 comprises a digital signal processor (DSP) for implementing signal processing functions. The ASIC IC 2 comprises memory which is partly shared by the MPU and the DSP. Furthermore, the ASIC IC 2 comprises logic circuits and interface logic (I/O logic).

The ASIC IC 2 is connected to a keypad 3 for mobile station functions. The mobile device 1 comprises a display device 4, which is controlled with a display driver 5. A microphone 6 is coupled via an audio block 7 to the ASIC IC 2. This audio block 7 contains a codec. The mobile device 1 comprises a speaker 8. The mobile device 1 comprises a radio frequency (RF) section 9 and an antenna 10 for transmitting calls between the mobile device 1 and a mobile communication network. A bus interface 11 is implemented between a SDRAM memory 12 and the ASIC IC 2. A bus interface 13 is implemented between a flash memory 14 and the ASIC IC 2.

Figure 2:
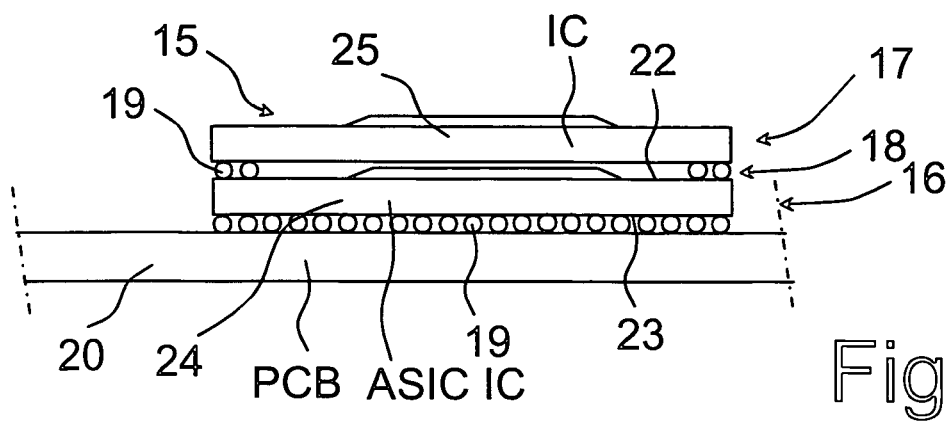
FIG. 2 is a cross-sectional view of the semiconductor device according to an embodiment of the present invention.

FIG. 2 shows a semiconductor device 15, which is of type POP and comprises a lower package 16 and an upper package 17. The lower package 16 is ASIC IC, whose functionality corresponds to ASIC IC 2 of FIG. 1, and the upper package 17 is memory IC, whose functionality corresponds to SDRAM memory 12 and flash memory 14 of FIG. 1, and to which is implemented as 32-bit DDR SDRAM memory and flash memory. The flash memory of the upper package is either NAND-type or NOR-type. Signals between packages take place via a bus interface 18, which in the example of FIG. 2 is implemented by means of solder balls 19, which form an area array. The functionality of the bus interface 18 corresponds to the functionality of the bus interfaces 11 and 13 of FIG. 1. Each solder ball 19 corresponds to an external terminal, via which a signal between ASIC IC package 16 and memory IC package is transmitted. The ASIC IC 16 according to the invention comprises an upper main surface 22, where a first plurality of external terminals 19 is disposed, and lower main surface 23 on the opposite side of the package, where a second plurality of external terminals 19 is disposed. The first plurality of external terminals 19 corresponds to the area array of FIG. 5 and the second plurality of external terminals 19 may correspond to the area array of FIG. 4 or FIG. 3.

Figure 3:
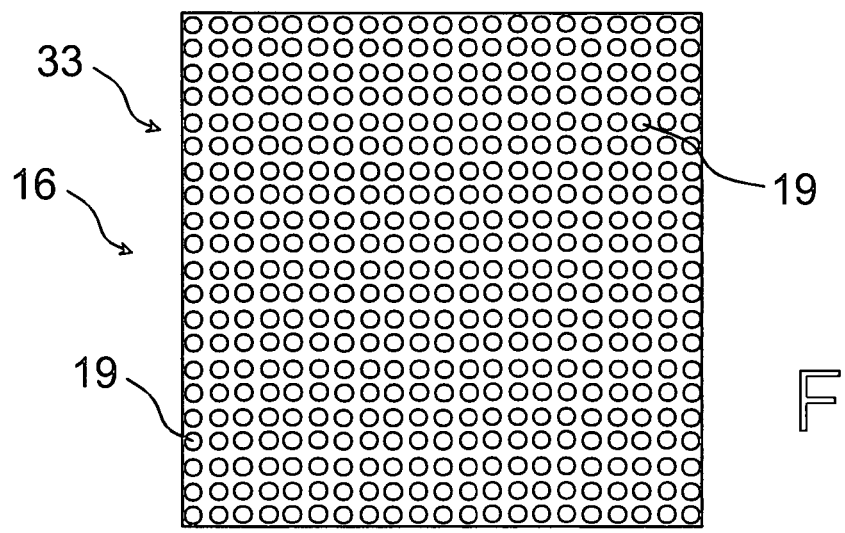
FIG. 3 is a bottom view of the semiconductor device according to an embodiment of the present invention.
Figure 4:
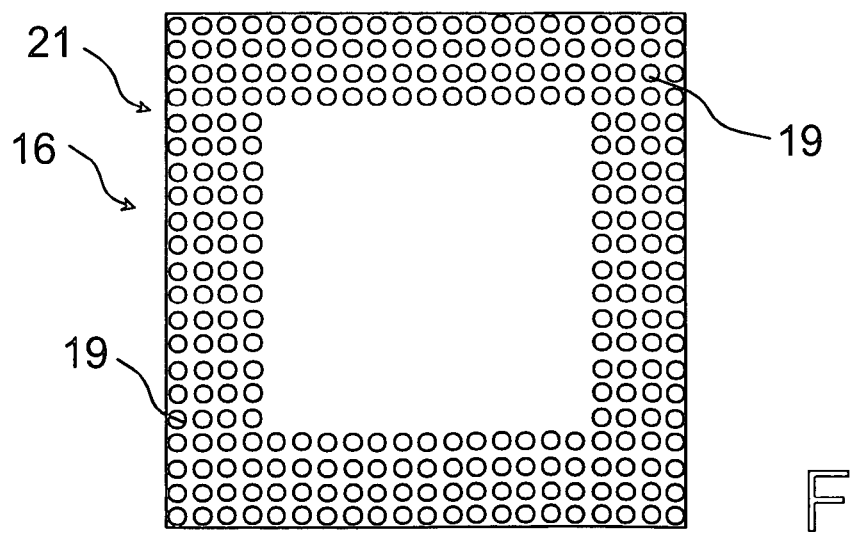
FIG. 4 is a bottom view of the semiconductor device according to another embodiment of the present invention.

The area array of the external terminals 19 between the lower package 16 and the circuit board 20, the solder balls in particular, vary as necessary. As an example, FIG. 3 shows an 21×21 area array 33, while FIG. 4 shows a 4-tier area array 21 of external terminals arranged in a rectangular form, which comprises a free area in the center. By means of the external terminals 19, the POP-package 15 connects to the circuit board 20 or other substrate where it is mounted on.

Table 1 shows a part of the signals intended for the use of memory IC package 17, which signals are transmitted via the interface 18 according to the invention. The memory IC package 17 is disposed on the ASIC IC package 16 as a POP-type package. The memory IC package 16 in use comprises flash memory, which is therefore either NAND-type or NOR-type, and the appropriate required signals are transmitted via the interface 18, where the same external terminal are in use for both NAND-type and NOR-type flash memories. The disclosed signals are standardized and known as such, and therefore their significance or operation is not disclosed in more detail in this description.

Table 1 shows those memory signals, which are directed via the same individual external terminal, and therefore it is not necessary to address a separate external terminal for, for example, NAND-type flash memory, which external terminal would then be unused when a NOR-type memory IC was installed in the package.

Table 1 discloses a coordinate, which describes the location of each external terminal 19 in the ASIC IC package 16, and in relation to the interconnection substrate 24 of the ASIC IC package 16, especially on the upper main surface 22 of the device of the ASIC IC package 16. A corresponding area array of external terminals is on the lower main surface of the interconnection substrate 25 of the memory IC package 17.

Figure 5:
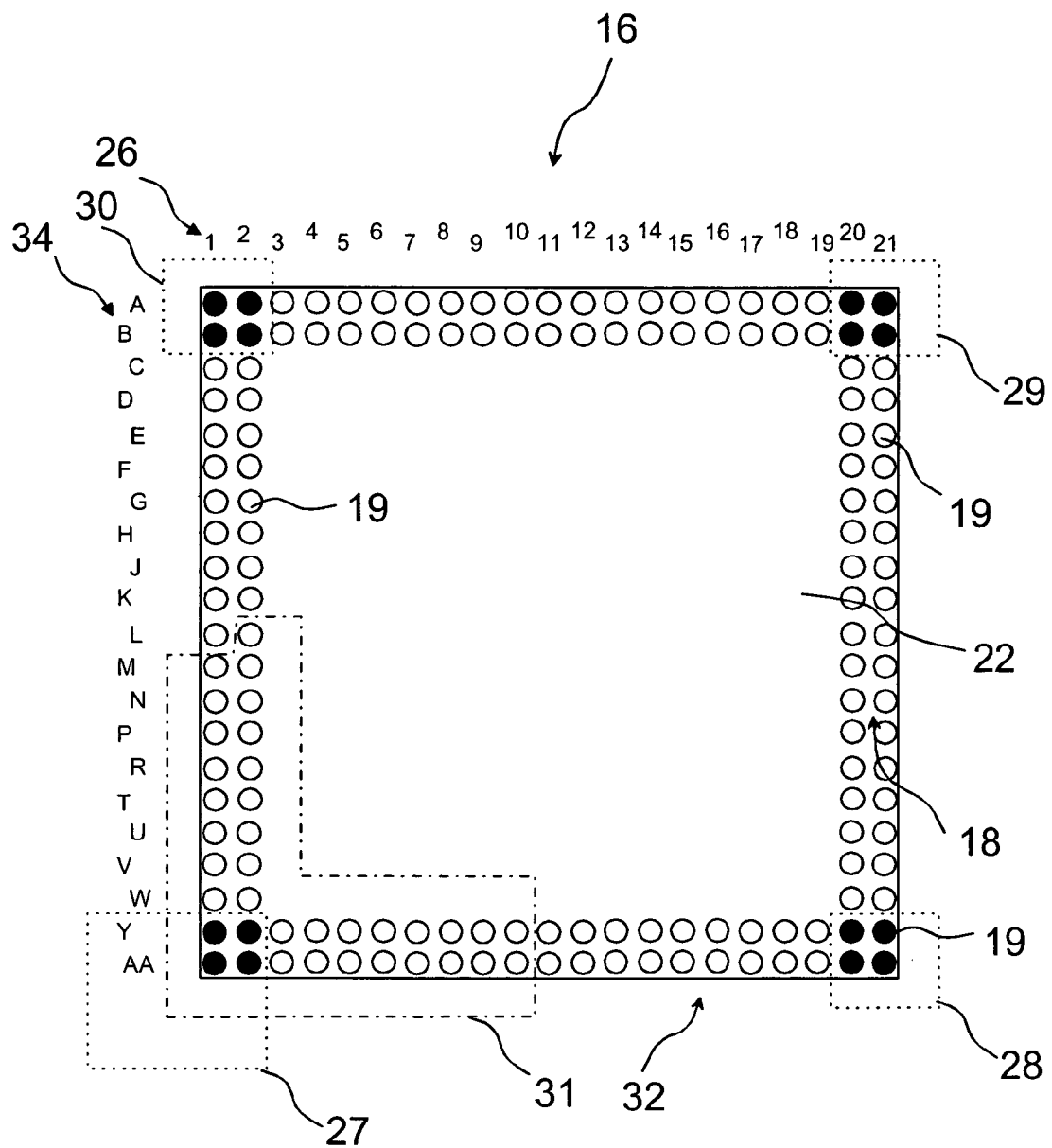
FIG. 5 is a top view of the semiconductor device according to an embodiment of the present invention.

The coordinate disclosed in table 1 is also disclosed in FIG. 5, and according to FIG. 5 the external terminals 19 are formed to the edge of the upper main surface 16 of the ASIC IC package 16 in a rectangular 2-tier layout form. The external terminals 19 extend horizontally the total of 21 columns 26, which are marked with numbers from 1 to 21 starting from the upper left corner of the ASIC IC package, and vertically 21 rows 34, which are marked with letters from A to AA (A, B, C, D, E, F, G, H, J, K, L, M, N, P, R, T, U, V, W, Y, AA) starting from the upper left corner of the ASIC IC package 16. A short description of the memory signal is also marked in the table 1.

TABLE 1

| External terminal coordinate | NAND interface | NOR interface | External terminal description |
| --- | --- | --- | --- |
| U2 | I/O 0 | ADQ 0 | Address/Data |
| U1 | I/O 1 | ADQ 1 | Address/Data |
| V2 | I/O 2 | ADQ 2 | Address/Data |
| V1 | I/O 3 | ADQ 3 | Address/Data |
| AA3 | I/O 4 | ADQ 4 | Address/Data |
| AA4 | I/O 5 | ADQ 5 | Address/Data |
| Y3 | I/O 6 | ADQ 6 | Address/Data |
| Y4 | I/O 7 | ADQ 7 | Address/Data |
| R1 | I/O 8 | ADQ 8 | Address/Data |
| T1 | I/O 9 | ADQ 9 | Address/Data |
| N1 | I/O 10 | ADQ 10 | Address/Data |
| P2 | I/O 11 | ADQ 11 | Address/Data |
| P1 | I/O 12 | ADQ 12 | Address/Data |
| M1 | I/O 13 | ADQ 13 | Address/Data |
| J2 | I/O 14 | ADQ 14 | Address/Data |
| K2 | I/O 15 | ADQ 15 | Address/Data |
| AA8 | /CE0 | /CE0mm | Chip enable |
| W1 | /CE1 | /CE1mm | Chip enable |
| Y10 | R/B0 | RDY0 | Ready output |
| Y8 | R/B1 | RDY1 | Ready output |
| AA9 | ALE | AVD | Address valid |
| K1 | /WE | /WEmm | Write enable |
| L2 | /RE | /OE | Output enable |
| AA5 | /RESET | /RESET | HW reset pin |
| T2 | Vcc | Vcc | Power supply |
| AA6 | Vccq | Vccq | Data out power |
| M2 | Vss | Vssmm | Ground |

TABLE 1-continued

| External terminal coordinate | NAND interface | NOR interface | External terminal description |
|---|---|---|---|
| R2 | Vss | Vssmm | Ground |
| Y6 | Vss | Vssmm | Ground |

The external terminals of table 1 form a part of the interface 31, which is meant for NOR-type or NAND-type memory IC. Interface 31 also comprises the external terminals of table 2. Especially the external terminals listed in table 1 are those predefined external terminals that are in use of both NOR-type and NAND-type memory IC interface 31. The external terminals of table 1 are shared, i.e. each external terminal is used by one type NOR memory signal and type NAND memory signal. Table 2, in turn, shows those external terminals 19 that are exclusively in use for memory when the semiconductor device 15 package comprises a memory IC package 17 comprising NAND-type memory. When the semiconductor device 15 package comprises a memory IC package 17 comprising NOR-type memory, the external terminals of table 2 are not in use (NC), in which case they are not "live" for transmitting signals.

TABLE 2

| External terminal coordinate | NAND interface | External terminal description |
|---|---|---|
| Y5 | /WP | Write protection |
| AA10 | CLE | Command latch enable |

Table 3, in turn, shows those external terminals 19 that are used exclusively by memory when the semiconductor device package 15 comprises a memory IC package 17 comprising NOR-type memory. When the semiconductor device package 15 comprises a memory IC package 17 comprising NAND-type memory, the external terminals of table 3 are not in use (NC), in which case they are not "live" for transmitting signals.

TABLE 3

| External terminal coordinate | NOR interface | External terminal description |
|---|---|---|
| L1 | CLKmm | Clock |
| Y9 | INT0 | Interrupt |
| W2 | INT1 | Interrupt |
| N2 | Vcc | Power supply |
| AA7 | Vssmm | Ground |
| Y7 | Vccq | Data out power |

Table 4 shows a part of the signals intended for the use of the memory IC package 17, which are transmitted via the interface 18 according to the invention. The memory IC package 17 is disposed on the ASIC IC package 16 as a POP-type package. The memory IC package 16 in use also comprises 32-bit DDR SDRAM memory, and the appropriate required signals are transmitted via the interface 18, which comprises external terminals 19 for memory. Said external terminals are not used by flash memory. The external terminals of table 4 form an interface 32, which is intended for DDR SDRAM memory in the ASIC IC package 16. The disclosed signals are standardized and known as such and their significance and operation is not disclosed more in detail in this description.

TABLE 4

| External terminal coordinate | DDR SDRAM interface | External terminal description |
|---|---|---|
| B13 | /CLKd | System differential clock |
| A12 | CLKd | System differential clock |
| T21 | /CS0 | Chip select |
| T20 | /CS1 | Chip select |
| G20 | A0 | Address input |
| K20 | A1 | Address input |
| J20 | A2 | Address input |
| J21 | A3 | Address input |
| U21 | A4 | Address input |
| R20 | A5 | Address input |
| M21 | A6 | Address input |
| M20 | A7 | Address input |
| N20 | A8 | Address input |
| K21 | A9 | Address input |
| Y16 | A10 | Address input |
| N21 | A11 | Address input |
| R21 | A12 | Address input |
| AA15 | A13 | Address input |
| Y12 | A14 | Address input |
| AA18 | BA0 | Bank select address |
| V20 | BA1 | Bank select address |
| V21 | /RAS | Row address strobe |
| U20 | /CAS | Column address strobe |
| Y18 | /WEd | Write enable |
| Y15 | CKE0 | Clock enable |
| Y13 | CKE1 | Clock enable |
| H1 | DQM0 | Data I/O mask |
| A4 | DQM1 | Data I/O mask |
| A14 | DQM2 | Data I/O mask |
| A18 | DQM3 | Data I/O mask |
| C2 | DQS0 | Data strobe |
| B8 | DQS1 | Data strobe |
| B15 | DQS2 | Data strobe |
| A19 | DQS3 | Data strobe |
| E1 | DQ0 | Data I/O |
| E2 | DQ1 | Data I/O |
| G2 | DQ2 | Data I/O |
| D1 | DQ3 | Data I/O |
| G1 | DQ4 | Data I/O |
| D2 | DQ5 | Data I/O |
| B3 | DQ6 | Data I/O |
| B4 | DQ7 | Data I/O |
| B10 | DQ8 | Data I/O |
| B6 | DQ9 | Data I/O |
| A8 | DQ10 | Data I/O |
| B9 | DQ11 | Data I/O |
| A9 | DQ12 | Data I/O |
| A5 | DQ13 | Data I/O |
| B7 | DQ14 | Data I/O |
| A6 | DQ15 | Data I/O |
| A10 | DQ16 | Data I/O |
| B11 | DQ17 | Data I/O |
| B12 | DQ18 | Data I/O |
| A11 | DQ19 | Data I/O |
| A17 | DQ20 | Data I/O |
| A16 | DQ21 | Data I/O |
| B18 | DQ22 | Data I/O |
| B17 | DQ23 | Data I/O |
| C20 | DQ24 | Data I/O |
| D20 | DQ25 | Data I/O |
| C21 | DQ26 | Data I/O |
| E20 | DQ27 | Data I/O |
| B19 | DQ28 | Data I/O |
| D21 | DQ29 | Data I/O |
| G21 | DQ30 | Data I/O |
| E21 | DQ31 | Data I/O |
| P21 | Vdd | Power supply |
| W21 | Vdd | Power supply |
| Y14 | Vdd | Power supply |
| AA11 | Vdd | Power supply |
| AA14 | Vdd | Power supply |
| AA19 | Vdd | Power supply |
| AA17 | Vdd | Power supply |

TABLE 4-continued

| External terminal coordinate | DDR SDRAM interface | External terminal description |
|---|---|---|
| P20 | Vssd | Ground |
| W20 | Vssd | Ground |
| P20 | Vssd | Ground |
| Y11 | Vssd | Ground |
| Y19 | Vssd | Ground |
| Y17 | Vssd | Ground |
| AA13 | Vssd | Ground |
| AA16 | Vssd | Ground |
| A3 | Vddq | Data output power |
| A15 | Vddq | Data output power |
| B16 | Vddq | Data output power |
| B5 | Vddq | Data output power |
| F2 | Vddq | Data output power |
| F21 | Vddq | Data output power |
| H21 | Vddq | Data output power |
| J1 | Vddq | Data output power |
| L20 | Vddq | Data output power |
| A7 | Vssq | Data output ground |
| A13 | Vssq | Data output ground |
| B14 | Vssq | Data output ground |
| C1 | Vssq | Data output ground |
| F1 | Vssq | Data output ground |
| F20 | Vssq | Data output ground |
| H2 | Vssq | Data output ground |
| H20 | Vssq | Data output ground |
| L21 | Vssq | Data output ground |
| AA12 | Temp.sense | Temperature sensing |

In the disposition of the external terminals 19, it has been especially taken into account that an optimized interface is reached by disposing some external terminals in a certain way according to Table 5. For example, two pairs of Vddq and Vssq signals are positioned in pairs in external terminals disposed next to each other, as shown in Table 5, either horizontally, vertically or diagonally. Thus, it is possible to minimize the memory IC package 17 problems caused by the return currents and to ensure power supply of good quality. This principle is also applied for other Vdd, Vssd, Vddq and Vssq signals, as shown in Table 4, and, when possible, for Vcc, Vccq and Vss signals of the NAND/NOR interface.

TABLE 5

| External terminal coordinate | DDR SDRAM interface | External terminal description |
|---|---|---|
| F2 | Vddq | Data output power |
| J1 | Vddq | Data output power |
| F1 | Vssq | Data output ground |
| H2 | Vssq | Data output ground |

In addition, an optimized interface is reached by disposing some external terminals in a certain way based on the byte usage. Altogether, four byte groups are built: DQ0-DQ7, DQ8-DQ15, DQ16-DQ23 and DQ24-DQ31. For example, a signal group, which comprises DQM0, DQS0 and DQ0-DQ7 signals using the same byte, is grouped in the same area according to Table 6, together with the signals of Table 5, wherein it is ensured that the least possible amount of mutual interference is produced between other corresponding signal groups, and the maximum clock frequency to be used is secured.

TABLE 6

| External terminal coordinate | DDR SDRAM interface | External terminal description |
|---|---|---|
| H1 | DQM0 | Data I/O mask |
| C2 | DQS0 | Data strobe |
| E1 | DQ0 | Data I/O |
| E2 | DQ1 | Data I/O |
| G2 | DQ2 | Data I/O |
| D1 | DQ3 | Data I/O |
| G1 | DQ4 | Data I/O |
| D2 | DQ5 | Data I/O |
| B3 | DQ6 | Data I/O |
| B4 | DQ7 | Data I/O |

In the semiconductor device 15 package according to the invention, which is of type POP, the external terminals according to table 7 are unused, especially those solder balls are not "live" for transmitting a signal (NC), but mechanically support the upper package 17 of the POP-type package 15. These external terminals 19 are located in the four corners of the package 15 and form 2×2 area arrays 27, 28, 29 and 30. Stress is directed to these external terminals and there is a danger of breaking, and therefore signals are not directed via them. In this manner, a better reliability of the entire semiconductor device 15 is reached and the operation is not interrupted as a result of an individual terminal breaking.

TABLE 7

| External terminal coordinate | NOR interface | NAND interface |
|---|---|---|
| A1, A2, B1, B2 | NC | NC |
| A20, A21, B20, B21 | NC | NC |
| Y1, Y2, AA1, AA2 | NC | NC |
| Y20, Y21, AA20, AA21 | NC | NC |

The invention was described specifically based on the above-described embodiments. It should however be borne in mind that the present invention is not limited by these embodiments. It is needless to say that various changes or modifications can be made within an extent not departing from the gist of the present invention.

What is claimed is:
1. An integrated circuit package comprising:
   an interconnection substrate including an ASIC integrated circuit and having a first main surface and a second main surface which are opposite to each other;
   a first plurality of external terminals disposed on the first main surface of said interconnection substrate; and
   a second plurality of external terminals disposed on the second main surface of said interconnection substrate;
   wherein said second plurality of external terminals comprises a predefined selection of external terminals defining a first interface for another integrated circuit memory package disposed on said first interface and having either type NAND memory or type NOR memory;
   wherein said selection of external terminals of the first interface includes shared external terminals that are used by both the type NAND memory and the type NOR memory;
   wherein said second plurality of external terminals comprises another predefined selection of external terminals defining a second interface for said other integrated circuit memory package disposed on said second interface and further having type 32-bit DDR SDRAM memory.

2. The integrated circuit package according to claim 1, wherein said ASIC integrated circuit package and said integrated circuit memory package constitute a package-on-package type integrated circuit package.

3. The integrated circuit package according to claim 1, wherein said first plurality of external terminals define a third interface for a printed circuit board.

4. The integrated circuit package according to claim 1, wherein said shared external terminals are defined according to TABLE 1:

TABLE 1

| External terminal coordinate | NAND interface | NOR interface | External terminal description |
|---|---|---|---|
| U2 | I/O 0 | ADQ 0 | Address/Data |
| U1 | I/O 1 | ADQ 1 | Address/Data |
| V2 | I/O 2 | ADQ 2 | Address/Data |
| V1 | I/O 3 | ADQ 3 | Address/Data |
| AA3 | I/O 4 | ADQ 4 | Address/Data |
| AA4 | I/O 5 | ADQ 5 | Address/Data |
| Y3 | I/O 6 | ADQ 6 | Address/Data |
| Y4 | I/O 7 | ADQ 7 | Address/Data |
| R1 | I/O 8 | ADQ 8 | Address/Data |
| T1 | I/O 9 | ADQ 9 | Address/Data |
| N1 | I/O 10 | ADQ 10 | Address/Data |
| P2 | I/O 11 | ADQ 11 | Address/Data |
| P1 | I/O 12 | ADQ 12 | Address/Data |
| M1 | I/O 13 | ADQ 13 | Address/Data |
| J2 | I/O 14 | ADQ 14 | Address/Data |
| K2 | I/O 15 | ADQ 15 | Address/Data |
| AA8 | /CE0 | /CE0mm | Chip enable |
| W1 | /CE1 | /CE1mm | Chip enable |
| Y10 | R/B0 | RDY0 | Ready output |
| Y8 | R/B1 | RDY1 | Ready output |
| AA9 | ALE | AVD | Address valid |
| K1 | /WE | /WEmm | Write enable |
| L2 | /RE | /OE | Output enable |
| AA5 | /RESET | /RESET | HW reset pin |
| T2 | Vcc | Vcc | Power supply |
| AA6 | Vccq | Vccq | Data out power |
| M2 | Vss | Vssmm | Ground |
| R2 | Vss | Vssmm | Ground |
| Y6 | Vss | Vssmm | Ground. |

5. The integrated circuit package according to claim 1, wherein said another predefined selection of external terminals is defined according to TABLE 4:

TABLE 4

| External terminal coordinate | DDR SDRAM interface | External terminal description |
|---|---|---|
| B13 | /CLKd | System differential clock |
| A12 | CLKd | System differential clock |
| T21 | /CS0 | Chip select |
| T20 | /CS1 | Chip select |
| G20 | A0 | Address input |
| K20 | A1 | Address input |
| J20 | A2 | Address input |
| J21 | A3 | Address input |
| U21 | A4 | Address input |
| R20 | A5 | Address input |
| M21 | A6 | Address input |
| M20 | A7 | Address input |
| N20 | A8 | Address input |
| K21 | A9 | Address input |
| Y16 | A10 | Address input |
| N21 | A11 | Address input |
| R21 | A12 | Address input |
| AA15 | A13 | Address input |
| Y12 | A14 | Address input |
| AA18 | BA0 | Bank select address |

TABLE 4-continued

| External terminal coordinate | DDR SDRAM interface | External terminal description |
|---|---|---|
| V20 | BA1 | Bank select address |
| V21 | /RAS | Row address strobe |
| U20 | /CAS | Column address strobe |
| Y18 | /WEd | Write enable |
| Y15 | CKE0 | Clock enable |
| Y13 | CKE1 | Clock enable |
| H1 | DQM0 | Data I/O mask |
| A4 | DQM1 | Data I/O mask |
| A14 | DQM2 | Data I/O mask |
| A18 | DQM3 | Data I/O mask |
| C2 | DQS0 | Data strobe |
| B8 | DQS1 | Data strobe |
| B15 | DQS2 | Data strobe |
| A19 | DQS3 | Data strobe |
| E1 | DQ0 | Data I/O |
| E2 | DQ1 | Data I/O |
| G2 | DQ2 | Data I/O |
| D1 | DQ3 | Data I/O |
| G1 | DQ4 | Data I/O |
| D2 | DQ5 | Data I/O |
| B3 | DQ6 | Data I/O |
| B4 | DQ7 | Data I/O |
| B10 | DQ8 | Data I/O |
| B6 | DQ9 | Data I/O |
| A8 | DQ10 | Data I/O |
| B9 | DQ11 | Data I/O |
| A9 | DQ12 | Data I/O |
| A5 | DQ13 | Data I/O |
| B7 | DQ14 | Data I/O |
| A6 | DQ15 | Data I/O |
| A10 | DQ16 | Data I/O |
| B11 | DQ17 | Data I/O |
| B12 | DQ18 | Data I/O |
| A11 | DQ19 | Data I/O |
| A17 | DQ20 | Data I/O |
| A16 | DQ21 | Data I/O |
| B18 | DQ22 | Data I/O |
| B17 | DQ23 | Data I/O |
| C20 | DQ24 | Data I/O |
| D20 | DQ25 | Data I/O |
| C21 | DQ26 | Data I/O |
| E20 | DQ27 | Data I/O |
| B19 | DQ28 | Data I/O |
| D21 | DQ29 | Data I/O |
| G21 | DQ30 | Data I/O |
| E21 | DQ31 | Data I/O |
| P21 | Vdd | Power supply |
| W21 | Vdd | Power supply |
| Y14 | Vdd | Power supply |
| AA11 | Vdd | Power supply |
| AA14 | Vdd | Power supply |
| AA19 | Vdd | Power supply |
| AA17 | Vdd | Power supply |
| P20 | Vssd | Ground |
| W20 | Vssd | Ground |
| P20 | Vssd | Ground |
| Y11 | Vssd | Ground |
| Y19 | Vssd | Ground |
| Y17 | Vssd | Ground |
| AA13 | Vssd | Ground |
| AA16 | Vssd | Ground |
| A3 | Vddq | Data output power |
| A15 | Vddq | Data output power |
| B16 | Vddq | Data output power |
| B5 | Vddq | Data output power |
| F2 | Vddq | Data output power |
| F21 | Vddq | Data output power |
| H21 | Vddq | Data output power |
| J1 | Vddq | Data output power |
| L20 | Vddq | Data output power |
| A7 | Vssq | Data output ground |
| A13 | Vssq | Data output ground |
| B14 | Vssq | Data output ground |
| C1 | Vssq | Data output ground |
| F1 | Vssq | Data output ground |

TABLE 4-continued

| External terminal coordinate | DDR SDRAM interface | External terminal description |
|---|---|---|
| F20 | Vssq | Data output ground |
| H2 | Vssq | Data output ground |
| H20 | Vssq | Data output ground |
| L21 | Vssq | Data output ground |
| AA12 | Temp.sense | Temperature sensing. |

6. The integrated circuit package according to claim 1, wherein said second plurality of external terminals includes external terminals according to TABLE 7 for supporting said integrated circuit memory package disposed on said second plurality of external terminals and said interconnection substrate including the ASIC integrated circuit:

TABLE 7

| External terminal coordinate | NOR interface | NAND interface |
|---|---|---|
| A1, A2, B1, B2 | NC | NC |
| A20, A21, B20, B21 | NC | NC |
| Y1, Y2, AA1, AA2 | NC | NC |
| Y20, Y21, AA20, AA21 | NC | NC. |

7. The integrated circuit package according to claim 1, wherein said another predefined selection of external terminals includes external terminals grouped optimally by byte usage.

8. An integrated circuit package of type package-on-package comprising:

an ASIC integrated circuit package with an interconnection substrate including an ASIC integrated circuit and having a first main surface and a second main surface which are opposite to each other;

a first plurality of external terminals disposed on the first main surface of said interconnection substrate;

a second plurality of external terminals disposed on the second main surface of said interconnection substrate; and an integrated circuit memory package having type 32-bit DDR SDRAM memory and disposed on said second plurality of external terminals and ASIC integrated circuit package;

wherein said second plurality of external terminals comprises a predefined selection of external terminals defining a first interface for said integrated circuit memory package disposed on said first interface and having either type NAND memory or type NOR memory;

wherein said selection of external terminals of the first interface includes shared external terminals that are used by both the type NAND memory and the type NOR memory;

wherein said second plurality of external terminals comprises another predefined selection of external terminals defining a second interface for said other integrated circuit memory package disposed on said second interface.

9. The integrated circuit package of type package-on-package according to claim 8, wherein said shared external terminals are defined according to TABLE 1:

TABLE 1

| External terminal coordinate | NAND interface | NOR interface | External terminal description |
|---|---|---|---|
| U2 | I/O 0 | ADQ 0 | Address/Data |
| U1 | I/O 1 | ADQ 1 | Address/Data |
| V2 | I/O 2 | ADQ 2 | Address/Data |
| V1 | I/O 3 | ADQ 3 | Address/Data |
| AA3 | I/O 4 | ADQ 4 | Address/Data |
| AA4 | I/O 5 | ADQ 5 | Address/Data |
| Y3 | I/O 6 | ADQ 6 | Address/Data |
| Y4 | I/O 7 | ADQ 7 | Address/Data |
| R1 | I/O 8 | ADQ 8 | Address/Data |
| T1 | I/O 9 | ADQ 9 | Address/Data |
| N1 | I/O 10 | ADQ 10 | Address/Data |
| P2 | I/O 11 | ADQ 11 | Address/Data |
| P1 | I/O 12 | ADQ 12 | Address/Data |
| M1 | I/O 13 | ADQ 13 | Address/Data |
| J2 | I/O 14 | ADQ 14 | Address/Data |
| K2 | I/O 15 | ADQ 15 | Address/Data |
| AA8 | /CE0 | /CE0mm | Chip enable |
| W1 | /CE1 | /CE1mm | Chip enable |
| Y10 | R/B0 | RDY0 | Ready output |
| Y8 | R/B1 | RDY1 | Ready output |
| AA9 | ALE | AVD | Address valid |
| K1 | /WE | /WEmm | Write enable |
| L2 | /RE | /OE | Output enable |
| AA5 | /RESET | /RESET | HW reset pin |
| T2 | Vcc | Vcc | Power supply |
| AA6 | Vccq | Vccq | Data out power |
| M2 | Vss | Vssmm | Ground |
| R2 | Vss | Vssmm | Ground |
| Y6 | Vss | Vssmm | Ground. |

10. The integrated circuit package of type package-on-package according to claim 8, wherein said another predefined selection of external terminals is defined according to TABLE 4:

TABLE 4

| External terminal coordinate | DDR SDRAM interface | External terminal description |
|---|---|---|
| B13 | /CLKd | System differential clock |
| A12 | CLKd | System differential clock |
| T21 | /CS0 | Chip select |
| T20 | /CS1 | Chip select |
| G20 | A0 | Address input |
| K20 | A1 | Address input |
| J20 | A2 | Address input |
| J21 | A3 | Address input |
| U21 | A4 | Address input |
| R20 | A5 | Address input |
| M21 | A6 | Address input |
| M20 | A7 | Address input |
| N20 | A8 | Address input |
| K21 | A9 | Address input |
| Y16 | A10 | Address input |
| N21 | A11 | Address input |
| R21 | A12 | Address input |
| AA15 | A13 | Address input |
| Y12 | A14 | Address input |
| AA18 | BA0 | Bank select address |
| V20 | BA1 | Bank select address |
| V21 | /RAS | Row address strobe |
| U20 | /CAS | Column address strobe |
| Y18 | /WEd | Write enable |
| Y15 | CKE0 | Clock enable |
| Y13 | CKE1 | Clock enable |
| H1 | DQM0 | Data I/O mask |
| A4 | DQM1 | Data I/O mask |
| A14 | DQM2 | Data I/O mask |
| A18 | DQM3 | Data I/O mask |

TABLE 4-continued

| External terminal coordinate | DDR SDRAM interface | External terminal description |
|---|---|---|
| C2 | DQS0 | Data strobe |
| B8 | DQS1 | Data strobe |
| B15 | DQS2 | Data strobe |
| A19 | DQS3 | Data strobe |
| E1 | DQ0 | Data I/O |
| E2 | DQ1 | Data I/O |
| G2 | DQ2 | Data I/O |
| D1 | DQ3 | Data I/O |
| G1 | DQ4 | Data I/O |
| D2 | DQ5 | Data I/O |
| B3 | DQ6 | Data I/O |
| B4 | DQ7 | Data I/O |
| B10 | DQ8 | Data I/O |
| B6 | DQ9 | Data I/O |
| A8 | DQ10 | Data I/O |
| B9 | DQ11 | Data I/O |
| A9 | DQ12 | Data I/O |
| A5 | DQ13 | Data I/O |
| B7 | DQ14 | Data I/O |
| A6 | DQ15 | Data I/O |
| A10 | DQ16 | Data I/O |
| B11 | DQ17 | Data I/O |
| B12 | DQ18 | Data I/O |
| A11 | DQ19 | Data I/O |
| A17 | DQ20 | Data I/O |
| A16 | DQ21 | Data I/O |
| B18 | DQ22 | Data I/O |
| B17 | DQ23 | Data I/O |
| C20 | DQ24 | Data I/O |
| D20 | DQ25 | Data I/O |
| C21 | DQ26 | Data I/O |
| E20 | DQ27 | Data I/O |
| B19 | DQ28 | Data I/O |
| D21 | DQ29 | Data I/O |
| G21 | DQ30 | Data I/O |
| E21 | DQ31 | Data I/O |
| P21 | Vdd | Power supply |
| W21 | Vdd | Power supply |
| Y14 | Vdd | Power supply |
| AA11 | Vdd | Power supply |
| AA14 | Vdd | Power supply |
| AA19 | Vdd | Power supply |
| AA17 | Vdd | Power supply |
| P20 | Vssd | Ground |
| W20 | Vssd | Ground |
| P20 | Vssd | Ground |
| Y11 | Vssd | Ground |
| Y19 | Vssd | Ground |
| Y17 | Vssd | Ground |
| AA13 | Vssd | Ground |
| AA16 | Vssd | Ground |
| A3 | Vddq | Data output power |
| A15 | Vddq | Data output power |
| B16 | Vddq | Data output power |
| B5 | Vddq | Data output power |
| F2 | Vddq | Data output power |
| F21 | Vddq | Data output power |
| H21 | Vddq | Data output power |
| J1 | Vddq | Data output power |
| L20 | Vddq | Data output power |
| A7 | Vssq | Data output ground |
| A13 | Vssq | Data output ground |
| B14 | Vssq | Data output ground |
| C1 | Vssq | Data output ground |
| F1 | Vssq | Data output ground |
| F20 | Vssq | Data output ground |
| H2 | Vssq | Data output ground |
| H20 | Vssq | Data output ground |
| L21 | Vssq | Data output ground |
| AA12 | Temp.sense | Temperature sensing. |

11. The integrated circuit package of type package-on-package according to claim 8, wherein said another predefined selection of external terminals comprises external terminals grouped optimally by byte usage.

12. A mobile device comprising an integrated circuit package having:
an interconnection substrate including an ASIC integrated circuit and having a first main surface and a second main surface which are opposite to each other;
a first plurality of external terminals disposed on the first main surface of said interconnection substrate; and
a second plurality of external terminals disposed on the second main surface of said interconnection substrate;
wherein said second plurality of external terminals comprises a predefined selection of external terminals defining a first interface for another integrated circuit memory package disposed on said first interface and having either type NAND memory or type NOR memory;
wherein said selection of external terminals of the first interface includes shared external terminals that are used by both the type NAND memory and the type NOR memory;
wherein said second plurality of external terminals comprises another predefined selection of external terminals defining a second interface for said other integrated circuit memory package disposed on said second interface and further having type 32-bit DDR SDRAM memory.

13. The mobile device according to claim 12, wherein said shared external terminals are defined according to TABLE 1:

TABLE 1

| External terminal coordinate | NAND interface | NOR interface | External terminal description |
|---|---|---|---|
| U2 | I/O 0 | ADQ 0 | Address/Data |
| U1 | I/O 1 | ADQ 1 | Address/Data |
| V2 | I/O 2 | ADQ 2 | Address/Data |
| V1 | I/O 3 | ADQ 3 | Address/Data |
| AA3 | I/O 4 | ADQ 4 | Address/Data |
| AA4 | I/O 5 | ADQ 5 | Address/Data |
| Y3 | I/O 6 | ADQ 6 | Address/Data |
| Y4 | I/O 7 | ADQ 7 | Address/Data |
| R1 | I/O 8 | ADQ 8 | Address/Data |
| T1 | I/O 9 | ADQ 9 | Address/Data |
| N1 | I/O 10 | ADQ 10 | Address/Data |
| P2 | I/O 11 | ADQ 11 | Address/Data |
| P1 | I/O 12 | ADQ 12 | Address/Data |
| M1 | I/O 13 | ADQ 13 | Address/Data |
| J2 | I/O 14 | ADQ 14 | Address/Data |
| K2 | I/O 15 | ADQ 15 | Address/Data |
| AA8 | /CE0 | /CE0mm | Chip enable |
| W1 | /CE1 | /CE1mm | Chip enable |
| Y10 | R/B0 | RDY0 | Ready output |
| Y8 | R/B1 | RDY1 | Ready output |
| AA9 | ALE | AVD | Address valid |
| K1 | /WE | /WEmm | Write enable |
| L2 | /RE | /OE | Output enable |
| AA5 | /RESET | /RESET | HW reset pin |
| T2 | Vcc | Vcc | Power supply |
| AA6 | Vccq | Vccq | Data out power |
| M2 | Vss | Vssmm | Ground |
| R2 | Vss | Vssmm | Ground |
| Y6 | Vss | Vssmm | Ground. |

14. The mobile device according to claim 12, wherein said another predefined selection of external terminals is defined according to TABLE 4:

TABLE 4

| External terminal coordinate | DDR SDRAM interface | External terminal description |
|---|---|---|
| B13 | /CLKd | System differential clock |
| A12 | CLKd | System differential |

TABLE 4-continued

| External terminal coordinate | DDR SDRAM interface | External terminal description |
| --- | --- | --- |
| | | clock |
| T21 | /CS0 | Chip select |
| T20 | /CS1 | Chip select |
| G20 | A0 | Address input |
| K20 | A1 | Address input |
| J20 | A2 | Address input |
| J21 | A3 | Address input |
| U21 | A4 | Address input |
| R20 | A5 | Address input |
| M21 | A6 | Address input |
| M20 | A7 | Address input |
| N20 | A8 | Address input |
| K21 | A9 | Address input |
| Y16 | A10 | Address input |
| N21 | A11 | Address input |
| R21 | A12 | Address input |
| AA15 | A13 | Address input |
| Y12 | A14 | Address input |
| AA18 | BA0 | Bank select address |
| V20 | BA1 | Bank select address |
| V21 | /RAS | Row address strobe |
| U20 | /CAS | Column address strobe |
| Y18 | /WEd | Write enable |
| Y15 | CKE0 | Clock enable |
| Y13 | CKE1 | Clock enable |
| H1 | DQM0 | Data I/O mask |
| A4 | DQM1 | Data I/O mask |
| A14 | DQM2 | Data I/O mask |
| A18 | DQM3 | Data I/O mask |
| C2 | DQS0 | Data strobe |
| B8 | DQS1 | Data strobe |
| B15 | DQS2 | Data strobe |
| A19 | DQS3 | Data strobe |
| E1 | DQ0 | Data I/O |
| E2 | DQ1 | Data I/O |
| G2 | DQ2 | Data I/O |
| D1 | DQ3 | Data I/O |
| G1 | DQ4 | Data I/O |
| D2 | DQ5 | Data I/O |
| B3 | DQ6 | Data I/O |
| B4 | DQ7 | Data I/O |
| B10 | DQ8 | Data I/O |
| B6 | DQ9 | Data I/O |
| A8 | DQ10 | Data I/O |
| B9 | DQ11 | Data I/O |
| A9 | DQ12 | Data I/O |
| A5 | DQ13 | Data I/O |
| B7 | DQ14 | Data I/O |
| A6 | DQ15 | Data I/O |
| A10 | DQ16 | Data I/O |
| B11 | DQ17 | Data I/O |
| B12 | DQ18 | Data I/O |
| A11 | DQ19 | Data I/O |
| A17 | DQ20 | Data I/O |
| A16 | DQ21 | Data I/O |
| B18 | DQ22 | Data I/O |
| B17 | DQ23 | Data I/O |
| C20 | DQ24 | Data I/O |
| D20 | DQ25 | Data I/O |
| C21 | DQ26 | Data I/O |
| E20 | DQ27 | Data I/O |
| B19 | DQ28 | Data I/O |
| D21 | DQ29 | Data I/O |
| G21 | DQ30 | Data I/O |
| E21 | DQ31 | Data I/O |
| P21 | Vdd | Power supply |
| W21 | Vdd | Power supply |
| Y14 | Vdd | Power supply |
| AA11 | Vdd | Power supply |
| AA14 | Vdd | Power supply |
| AA19 | Vdd | Power supply |
| AA17 | Vdd | Power supply |
| P20 | Vssd | Ground |
| W20 | Vssd | Ground |
| P20 | Vssd | Ground |
| Y11 | Vssd | Ground |
| Y19 | Vssd | Ground |
| Y17 | Vssd | Ground |
| AA13 | Vssd | Ground |
| AA16 | Vssd | Ground |
| A3 | Vddq | Data output power |
| A15 | Vddq | Data output power |
| B16 | Vddq | Data output power |
| B5 | Vddq | Data output power |
| F2 | Vddq | Data output power |
| F21 | Vddq | Data output power |
| H21 | Vddq | Data output power |
| J1 | Vddq | Data output power |
| L20 | Vddq | Data output power |
| A7 | Vssq | Data output ground |
| A13 | Vssq | Data output ground |
| B14 | Vssq | Data output ground |
| C1 | Vssq | Data output ground |
| F1 | Vssq | Data output ground |
| F20 | Vssq | Data output ground |
| H2 | Vssq | Data output ground |
| H20 | Vssq | Data output ground |
| L21 | Vssq | Data output ground |
| AA12 | Temp.sense | Temperature sensing. |

15. The mobile device according to claim 12, wherein said another predefined selection of external terminals comprises external terminals grouped optimally by byte usage.

* * * * *